(12) United States Patent  
Saimen

(10) Patent No.: US 7,390,733 B2  
(45) Date of Patent: Jun. 24, 2008

(54) METHOD OF MANUFACTURING A SEMICONDUCTOR DEVICE INCLUDING A PROTRUDING ELECTRODE BONDED TO A LEAD ELECTRODE

(75) Inventor: Munehide Saimen, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/853,285

(22) Filed: May 26, 2004

(65) Prior Publication Data

US 2005/0006762 A1  Jan. 13, 2005

(30) Foreign Application Priority Data

Jun. 2, 2003  (JP) ............................. 2003-156847

(51) Int. Cl.  
*H01L 21/44* (2006.01)

(52) U.S. Cl. ............... 438/612; 438/611; 257/E33.066

(58) Field of Classification Search ......... 438/611–615; 257/E33.066  
See application file for complete search history.

(56) References Cited

U.S. PATENT DOCUMENTS

| 6,223,429 B1 | 5/2001 | Kaneda et al. |
| 6,277,222 B2 | 8/2001 | Morimoto et al. |
| 2002/0149118 A1* | 10/2002 | Yamaguchi et al. ......... 257/778 |
| 2003/0038367 A1* | 2/2003 | Yamaguchi ................. 257/734 |

FOREIGN PATENT DOCUMENTS

| JP | 03-060036 A | 3/1991 |
| JP | 10-308415 A | 11/1998 |
| JP | 11-312711 A | 9/1999 |
| JP | 2003-332371 A | 11/2003 |
| WO | WO96/42107 | 12/1996 |

* cited by examiner

*Primary Examiner*—Cuong Q Nguyen  
(74) *Attorney, Agent, or Firm*—Oliff & Berridge, PLC

(57) ABSTRACT

To enhance bonding accuracy of a bump electrode, while coping with narrowing pitch of the bump electrodes, a protruding electrode, whose leading end is sharpened, is provided to a semiconductor chip, and the protruding electrode is bonded to a lead electrode, while having a leading end of the protruding electrode bite into the lead electrode.

2 Claims, 4 Drawing Sheets

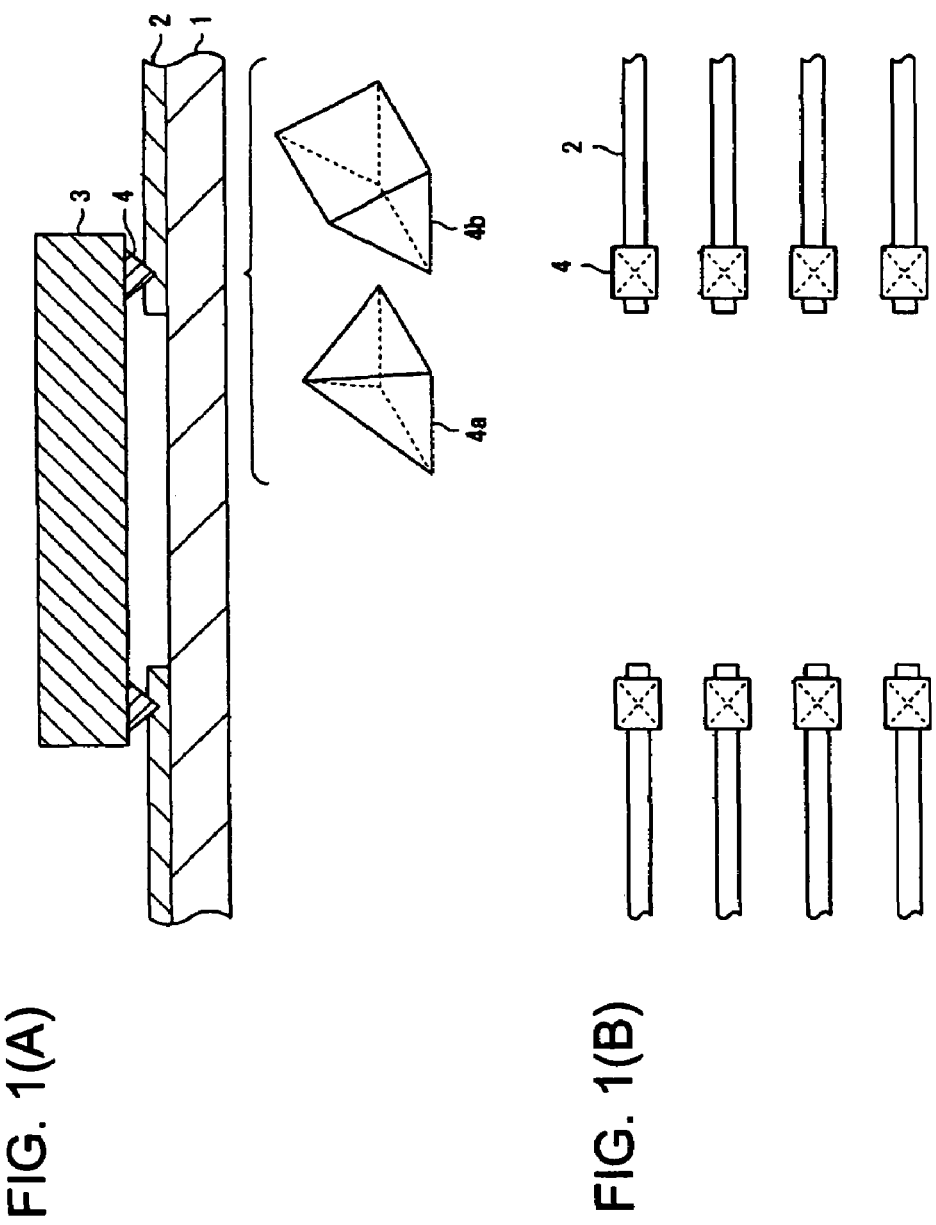

METHOD OF MANUFACTURING A SEMICONDUCTOR DEVICE INCLUDING A PROTRUDING ELECTRODE BONDED TO A LEAD ELECTRODE

BACKGROUND OF THE INVENTION

1. Field of Invention

The present invention relates to a semiconductor device, a semiconductor module, and a method of manufacturing the semiconductor device, and in particular is suitably applied to a bump electrode, used for a flip-chip method, a TAB (Tape Automated Bonding) method or the like.

2. Description of Related Art

In a related art TCP (Tape Carrier Package), COF (Chip On Film), COG (Chip On Glass) or the like, there is a method of forming a bump electrode on a semiconductor chip, for example, as disclosed in PCT international application: No. WO96/42107, in order to couple a semiconductor chip and a motherboard.

SUMMARY OF THE INVENTION

However, because the cross-sectional shape of the related art bump electrode is a trapezoid, the top width of the bump electrode becomes wide. For this reason, a high load is applied at the time of bonding the bump electrode, and there is a problem that damage occurs in a semiconductor chip or the like. Moreover, as an array pitch of bump electrode becomes narrow, the height of the bump electrode becomes larger than the top width of the bump electrode. This causes the degradation of flatness of the bump electrode. Thus, there are also problems that positional offset occurs and bump breakage occurs at the time of bonding the bump electrode.

The present invention provides a semiconductor device, a semiconductor module, and a method of manufacturing the semiconductor device, which can enhance the bonding accuracy of a protruding electrode, while coping with narrowing pitch of the protruding electrodes.

In order to address the above-described problems, a semiconductor device according to one exemplary embodiment of the present invention includes a semiconductor chip, and a protruding electrode, provided to the semiconductor chip and whose leading end is sharpened. Accordingly, the protruding electrode can be bonded to the lead electrode, while having the leading end of the protruding electrode bite into the lead electrode. For this reason, the protruding electrode can be bonded to the lead electrode, while securing the protruding electrode to the lead electrode. Thus, the positional offset of the protruding electrode can be reduced or prevented, and the protruding electrode can be bonded with sufficient accuracy. Moreover, the load can be concentrated on the leading end of the protruding electrode when bonding the protruding electrode to the lead electrode, and the load at the time of bonding the protruding electrode can be reduced. Thus, the damage to the semiconductor chip can be reduced. Furthermore, by sharpening the leading end of the protruding electrode, it becomes unnecessary to flatten the top surface of the protruding electrode, which eliminates the need to control the flatness of the protruding electrode and enables coping with narrowing pitch of the protruding electrodes more easily.

Moreover, in the semiconductor device according to one exemplary embodiment of the present invention, an average width of the leading end of the protruding electrode is 5 μm or less. This allows the leading end of the protruding electrode to bite into the lead electrode easily. The positional offset of the protruding electrode can be reduced or prevented when bonding the protruding electrode to the lead electrode. Furthermore, the load can be concentrated on the leading end of the protruding electrode. Thus the load at the time of bonding the protruding electrode can be reduced.

Moreover, a semiconductor device according to one exemplary embodiment of the present invention includes a semiconductor chip, a protruding electrode, provided to the semiconductor chip, and a protruding portion, provided to the leading end of the protruding electrode. Accordingly, the protruding electrode can be bonded to the lead electrode, while having the protruding portion, which is provided to the protruding electrode, bite into the lead electrode. For this reason, the protruding electrode can be bonded to the lead electrode, while securing the protruding electrode to the lead electrode. Thus, the positional offset of the protruding electrode can be reduced or prevented, and the protruding electrode can be bonded with sufficient accuracy. Moreover, the load can be concentrated on the protruding portion, provided to the protruding electrode, when bonding the protruding electrode to the lead electrode, and the load at the time of bonding the protruding electrode can be reduced. Thus, the damage to the semiconductor chip can be reduced. Furthermore, by providing the protruding portion to the protruding electrode, it becomes unnecessary to flatten the top surface of the protruding electrode, which eliminates the need to control the flatness of the protruding electrode, and enables coping with narrowing pitch of the protruding electrodes easily.

Moreover, a semiconductor module according to one exemplary embodiment of the present invention includes a semiconductor chip, a protruding electrode, provided to the semiconductor chip and whose leading end is sharpened, a lead electrode, to which the protruding electrode is bonded, and a base material, where the lead electrode is formed. Accordingly, the protruding electrode can be bonded to the lead electrode, while having the leading end of the protruding electrode bite into the lead electrode. The positional offset of the protruding electrode can be reduced or prevented when bonding the protruding electrode to the lead electrode. Furthermore, the load can be concentrated on the leading end of the protruding electrode, and the load at the time of bonding the protruding electrode can be reduced.

Moreover, a semiconductor module according to one exemplary embodiment of the present invention includes a semiconductor chip, a protruding electrode, provided to the semiconductor chip, a protruding portion, provided to the leading end of the protruding electrode, a lead electrode, to which the protruding electrode is bonded through the protruding portion, and a base material, where the lead electrode is formed. Accordingly, the protruding electrode can be bonded to the lead electrode, while having the protruding portion bite into the lead electrode. Thus, the positional offset of the protruding electrode can be reduced or prevented when bonding the protruding electrode to the lead electrode. Furthermore, the load can be concentrated on the protruding portion, and the load at the time of bonding the protruding electrode can be reduced.

Moreover, a method of manufacturing a semiconductor device according to one exemplary embodiment of the present invention includes: forming a first resist layer on or above a semiconductor substrate, where an electrode pad is formed; forming a first opening portion, corresponding to the position of the electrode pad, in the first resist layer by patterning the first resist layer; forming a protruding electrode on the electrode pad by embedding a conductive layer in the first opening portion; removing the first resist layer; forming a second resist layer on or above the semiconductor substrate, where the protruding electrode is formed; forming a second opening portion, whose opening area is smaller than the first opening portion, above the protruding electrode by patterning the second resist layer; forming a protruding portion on the protruding electrode by embedding a conductive layer in the second opening portion; and removing the second resist layer.

Accordingly, the protruding portion can be provided to the leading end of the protruding electrode by using plating, while the thickness of the protruding portion can be easily adjusted by adjusting the opening area of the second opening portion. For this reason, the protruding electrodes having the protruding portions can be collectively formed on a plurality of electrode pads, the bonding accuracy of the protruding electrode can be enhanced, while suppressing the complication of the manufacturing process and enabling coping with narrowing pitch of the protruding electrodes.

Moreover, a method of manufacturing a semiconductor device according to one exemplary embodiment of the present invention includes: forming a conductive layer on or above a semiconductor substrate, where an electrode pad is formed; forming a resist layer on or above a semiconductor substrate, where the conductive layer is formed; removing the resist layer around the electrode pad by patterning the resist layer; and removing the conductive layer around the electrode pad by carrying out an isotropic etching of the conductive layer using the patterned resist layer as a mask.

Accordingly, the etching amount in the thickness direction of the conductive layer can be changed. The etching amount in the horizontal direction can be increased as approaching to the top surface of the conductive layer. For this reason, the protruding electrode can be formed while sharpening the leading end of the protruding electrode. The bonding accuracy of the protruding electrode can be enhanced, while suppressing the complication of the manufacturing process and enabling coping with narrowing pitch of the protruding electrodes.

Moreover, a method of manufacturing a semiconductor device according to one exemplary embodiment of the present invention includes: forming a protruding electrode, whose leading end is sharpened, on an electrode pad by discharging a conductive material on the electrode pad, which is formed on a semiconductor substrate. Accordingly, the shape of the protruding electrode can be changed by controlling the discharging position of the conductive material, thus the protruding electrode, whose leading end is sharpened, can be easily formed.

BRIEF DESCRIPTION OF THE DRAWINGS

FIGS. 1(A) and 1(B) are schematics of a semiconductor module according to a first exemplary embodiment;

DETAILED DESCRIPTION OF EXEMPLARY EMBODIMENTS

Figure 2A:
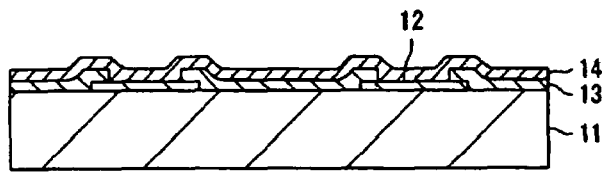
FIGS. 2(A)-2(F) are cross-sectional schematics showing a method of manufacturing a protruding electrode according to a second exemplary embodiment.

Hereinafter, a semiconductor module and a method of manufacturing a semiconductor device according to exemplary embodiments of the present invention will be described with reference to drawings. FIG. 1(A) is a cross-sectional schematic showing a semiconductor module according to a first exemplary embodiment of the present invention, and FIG. 1(B) is a schematic of protruding electrodes and lead electrodes of FIG. 1(A).

In FIG. 1, a lead electrode 2 is formed on a film substrate 1. A protruding electrode 4, whose leading end is sharpened, is formed on a semiconductor chip 3. Then, the semiconductor chip 3 is mounted above the film substrate 1 by bonding the protruding electrode 4 onto the lead electrode 2. As for the shape of the protruding electrode 4, for example, a pyramid type protruding electrode 4a or a prism type protruding electrode 4b can be employed. The width of the bottom surface of the protruding electrode 4 can be set to approximately 15 µm. The width of the lead electrode 2 can be set to approximately 10 µm, for example. Moreover, the average width of the leading end of the protruding electrode may be set to 5 µm or less.

Accordingly, the protruding electrode 4 can be bonded to the lead electrode 2, while having the leading end of the protruding electrode 4 bite into the lead electrode 2. For this reason, the protruding electrode 4 can be bonded to the lead electrode 2, while securing the protruding electrode 4 to the lead electrode 2. Thus, the positional offset of the protruding electrode 4 can be reduced or prevented, and the protruding electrode 4 can be bonded with sufficient accuracy. Furthermore, the load can be concentrated on the leading end of the protruding electrode 4 when bonding the protruding electrode 4 to the lead electrode 2, and the load at the time of bonding the protruding electrode 4 can be reduced. Thus, the damage to the semiconductor chip 3 can be reduced. Furthermore, by sharpening the leading end of the protruding electrode 4, it becomes unnecessary to flatten the top surface of the protruding electrode 4, which eliminates the need to control the flatness of the protruding electrode 4 and enables coping with narrowing pitch of the protruding electrodes 4.

In the exemplary embodiment of FIG. 1, a method of forming the lead electrode 2 on the film substrate 1 is described. However, in addition to the film substrate 1, for example, a printed circuit board, a multilayer-interconnection substrate, a build-up substrate, a tape substrate, a glass substrate or the like may be employed. Moreover, as for the material of the substrate, where the lead electrode 2 is formed, for example, polyimide resin, glass epoxy resin, BT resin, a composite of aramid and epoxy, or ceramics or the like can be used. Moreover, as for the protruding electrode 4, for example, Au bump, Au/Ni bump, Cu bump and Ni bump coated with solder material, or a solder ball or the like can be used. Moreover, as for the lead electrode, for example, copper (Cu), iron (Fe), gold (Au), silver (Ag), copper (Cu) coated with solder material, copper (Cu) coated with gold (Au) or the like can be used.

Moreover, when bonding the protruding electrode 4 to the lead electrode 2, for example, metal bonding, such as solder bonding, alloy bonding may be used, and pressure-welding bonding, such as ACF (Anisotropic Conductive Film) bonding, NCF (Nonconductive Film) bonding, ACP (Anisotropic Conductive Paste) bonding, NCP (Nonconductive Paste) bonding may be used. Moreover, in the above-described exemplary embodiment, a method of arranging the lead electrode 2 and the protruding electrodes 4 in a straight array is described. However, the lead electrode 2 and the protruding electrodes 4 may be arranged, for example, in a staggered array or in a radial arrangement.

Moreover, in the above-described exemplary embodiment, the COF (Chip On Film) is described as an example, however, the exemplary embodiment may be applied to all semiconductor packages, in which a face-down mounting, such as TCP (Tape Carrier Package), COG (Chip On Glass), TCM (Tape Carrier Module), is carried out. Moreover, in the above-described exemplary embodiment, the case where the width of the bottom surface of the protruding electrode 4 is larger than the width of the lead terminal 2 is described as an example. However, the width of the bottom surface of the protruding electrode 4 may be the same as the width of the lead terminal 2, or the width of the bottom surface of the protruding electrode 4 may be smaller than the width of the lead terminal 2. Moreover, the leading end of the protruding electrode 4 may be rounded.

FIG. 2 is a cross-sectional schematic showing a method of manufacturing a protruding electrode according to a second exemplary embodiment of the present invention. In FIG. 2(A), an electrode pad 12 is provided to a semiconductor substrate 11, where active elements, such as transistors are formed, and an insulating layer 13 is formed on the semiconductor substrate 11 such that the electrode pad 12 is exposed. Then, a seed electrode 14 is formed on the insulating layer 13 including the electrode pad 12 by electroless plating, sputtering, or vapor deposition, for example. As for the seed electrode 14, conductive materials, such as nickel (Ni), chromium (Cr), titanium (Ti), and tungsten (W), can be used.

Figure 2B:
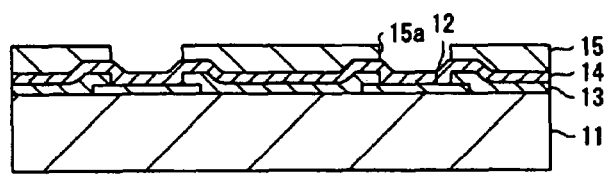
Figure 2C:
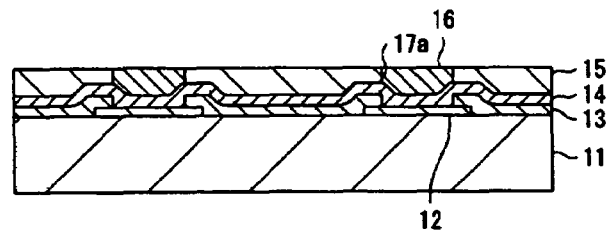

Next, as shown in FIG. 2(B), a resist layer 15 is formed above the semiconductor substrate 11, where the seed electrode 14 is formed. An opening portion 15a, arranged on the electrode pad 12, is formed in the resist layer 15 by exposing and developing the resist layer 15. Next, as shown in FIG. 2(C), a protruding electrode 16, coupled to the seed electrode 14, is formed in the opening portion 15a by carrying out electrolytic plating using the seed electrode 14 as a plating lead. As for the protruding electrode 16, nickel (Ni), gold (Au), copper (Cu), solder material or the like can be used.

Figure 2D:
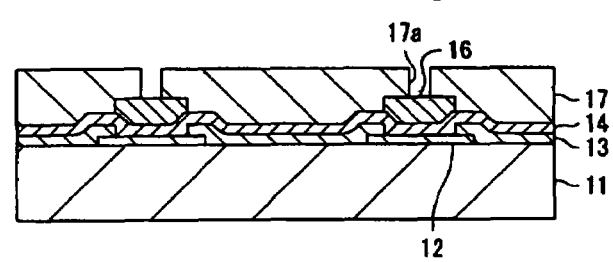

Next, as shown in FIG. 2(D), the resist layer 15 is removed. Then, a resist layer 17 is formed on or above the semiconductor substrate 11, where the protruding electrode 16 is formed. An opening portion 17a, arranged above the protruding electrode 16, is formed in the resist layer 17 by exposing and developing the resist layer 17. The opening area of the opening portion 17a can be made smaller than the opening area of the opening portion 15a.

Figure 2E:
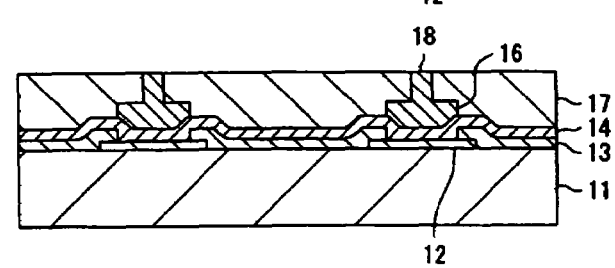
Figure 2F:
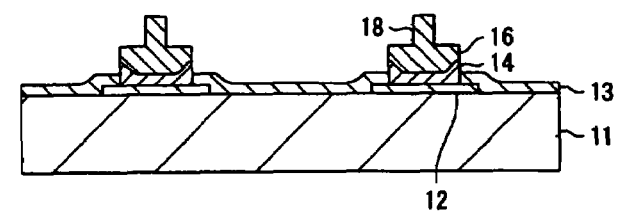

Next, as shown in FIG. 2(E), a protruding portion 18, arranged on the protruding electrode 16, is formed in the opening portion 17a by carrying out electrolytic plating using the seed electrode 14 as a plating lead. As for the protruding portion 18, nickel (Ni), gold (Au), copper (Cu), solder material or the like can be used, for example. Next, as shown in FIG. 2(F), the resist layer 17 is removed. Then, the insulating layer 13 is exposed by etching the seed electrode 14 using the protruding electrode 16 as a mask.

Accordingly, the protruding portion 18 can be provided to the leading end of the protruding electrode 16 using electrolytic plating, while the thickness of the protruding portion 18 can be easily adjusted by adjusting the opening area of the opening portion 17a formed in the resist layer 17. For this reason, the protruding electrodes 16 having the protruding portions 18 can be collectively formed on a plurality of electrode pads 12. The bonding accuracy of the protruding electrode 16 can be enhanced, while suppressing the complication of the manufacturing process and enabling coping with narrowing pitch of the protruding electrodes 16.

In the exemplary embodiment of FIG. 2, a method of forming the protruding electrode 16 having the protruding portion 18 by electrolytic plating is described. However, the protruding electrode 16 having the protruding portion 18 may be formed by electroless plating. Moreover, the protruding portion 18 may be rounded. FIG. 3 is a cross-sectional schematic showing a method of manufacturing a protruding electrode according to a third exemplary embodiment of the present invention.

Figure 3A:
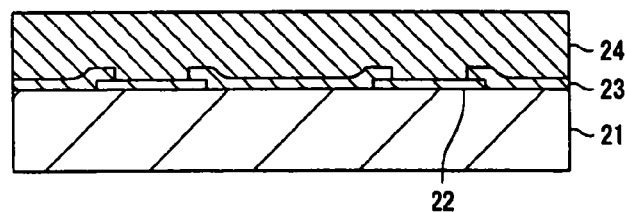
FIGS. 3(A)-3(D) are cross-sectional schematics showing a method of manufacturing a protruding electrode according to a third exemplary embodiment.

In FIG. 3(A), an electrode pad 22 is provided on a semiconductor substrate 21, where active elements, such as transistors are formed. An insulating layer 23 is formed on the semiconductor substrate 21 such that the electrode pad 22 is exposed. Then, a conductive layer 24 is formed on the insulating layer 23 by attaching a metal foil, made of copper (Cu) or the like, onto the insulating layer 23.

Figure 3B:
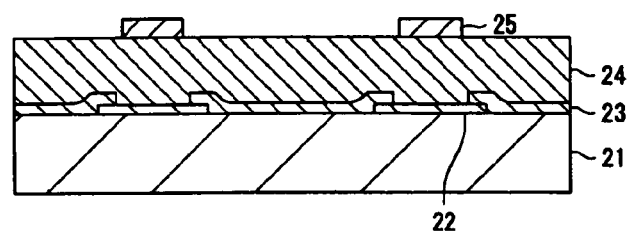
Figure 3C:
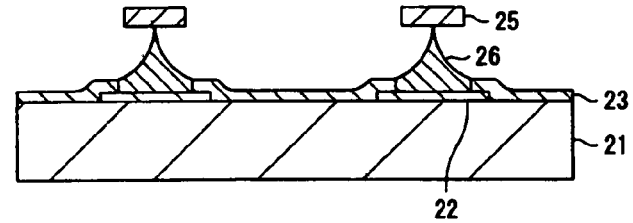
Figure 3D:
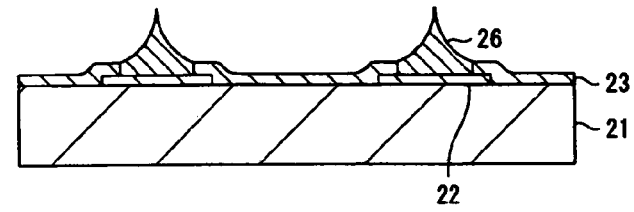

Next, as shown in FIG. 3(B), resist is applied onto the conductive layer 24. Then, by exposing and developing the resist, which is applied on the conductive layer 24, a resist layer 25, arranged corresponding to the position of the electrode pad 22, is formed on the conductive layer 24. Next, as shown in FIG. 3(C), by carrying out an isotropic etching of the conductive layer 24 using the resist layer 25 as a mask, the surface of the insulating layer 23 is exposed. A protruding electrode 26, whose leading end is sharpened, is formed on the electrode pad 22. A wet etching or a plasma etching or the like can be used for an isotropic etching of the conductive layer 24. Then, as shown in FIG. 3(D), the resist layer 25 on the protruding electrode 26 is removed.

By exposing the surface of the insulating layer 23 using an isotropic etching of the conductive layer 24, the etching amount in the thickness direction of the conductive layer 24 can be changed. The etching amount in the horizontal direction can be increased as approaching to the top surface of the conductive layer 24. For this reason, the protruding electrode 26 can be formed, while sharpening the leading end of the protruding electrode 26, and the bonding accuracy of the protruding electrode 26 can be enhanced, while suppressing the complication of the manufacturing process and enabling coping with narrowing pitch of the protruding electrodes 26.

In the exemplary embodiment of FIG. 3, a method of forming the conductive layer 24 on the insulating layer 23 by attaching a metal foil onto the insulating layer 23 is described. However, the conductive layer 24 may be formed on the insulating layer 23 using a method of plating or the like. FIG. 4 is a cross-sectional schematic showing a method of manufacturing a protruding electrode according to a fourth exemplary embodiment of the present invention.

Figure 4A:
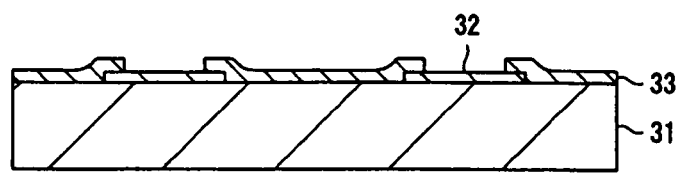
FIGS. 4(A) and 4(B) are cross-sectional schematics showing a method of manufacturing a protruding electrode according to a fourth exemplary embodiment.
Figure 4B:
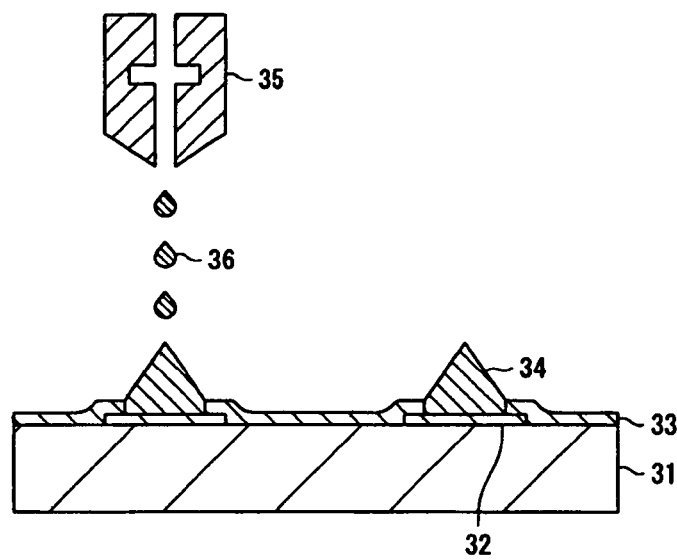

In FIG. 4(A), an electrode pad 32 is provided on a semiconductor substrate 31, where active elements, such as transistors are formed. An insulating layer 33 is formed on the semiconductor substrate 31 such that the electrode pad 32 is exposed. Next, as shown in FIG. 4(B), a protruding electrode 34, whose leading end is sharpened, is formed on the electrode pad 32 by discharging a droplet 36, which is composed of conductive material, onto the electrode pad 32 through an ink jet head 35. As for the droplet 36, for example, metal slurry or metal paste, in which metal powders, such as nickel (Ni), gold (Au), or copper (Cu) is dispersed in a solvent, can be used.

Accordingly, the shape of the protruding electrode 34 can be changed by controlling the discharging position of the droplet 36. Thus the protruding electrode 34, whose leading end is sharpened, can be easily formed on the electrode pad 32.

What is claimed is:

1. A method of manufacturing a semiconductor device, comprising:
    forming a first resist layer at a semiconductor substrate, where an electrode pad is formed;
    forming a first opening portion, corresponding to a position of the electrode pad, in the first resist layer by patterning the first resist layer;

forming a protruding electrode at the electrode pad by embedding a conductive layer in the first opening portion;

removing the first resist layer;

forming a second resist layer at the semiconductor substrate, where the protruding electrode is formed;

forming a second opening portion, whose opening area is smaller than the first opening portion and is aligned with the first opening portion, at the protruding electrode by patterning the second resist layer, the opening area of the second opening portion being adjusted so that the protruding electrode has a prism shape with a leading edge that is continuously sharpened;

forming a protruding portion at the protruding electrode by embedding a conductive layer in the second opening portion; and removing the second resist layer, the first resist layer and the second resist layer not being removed together.

2. A method of manufacturing a semiconductor device, comprising:

forming a first resist layer at a semiconductor substrate, where an electrode pad is formed;

forming a first opening portion, corresponding to a position of the electrode pad, in the first resist layer by patterning the first resist layer;

forming a protruding electrode at the electrode pad by embedding a conductive layer in the first opening portion;

removing the first resist layer;

forming a second resist layer at the semiconductor substrate, where the protruding electrode is formed;

forming a second opening portion, whose opening area is smaller than the first opening portion and is aligned with the first opening portion, at the protruding electrode by patterning the second resist layer, the opening area of the second opening portion being adjusted so that the protruding electrode has a prism shape with a leading edge that is continuously sharpened;

forming a protruding portion at the protruding electrode by embedding a conductive layer in the second opening portion; and removing the second resist layer, the removing of the first resist layer, the forming of the second resist layer, and the removing of the second resist layer being performed in that order.

* * * * *